United States Patent
Ganta Papa Rao Bala et al.

(10) Patent No.: US 11,521,908 B2
(45) Date of Patent: Dec. 6, 2022

(54) HEATER ELEMENTS FOR PROCESSOR DEVICES

(71) Applicant: HEWLETT PACKARD ENTERPRISE DEVELOPMENT LP, Houston, TX (US)

(72) Inventors: Sunil Rao Ganta Papa Rao Bala, Houston, TX (US); Matthew Kielbasa, Houston, TX (US); Harvey Edward White, Jr., Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 16/930,877

(22) Filed: Jul. 16, 2020

(65) Prior Publication Data

US 2022/0020660 A1  Jan. 20, 2022

(51) Int. Cl.
  *H01L 23/367* (2006.01)
  *H01L 23/34* (2006.01)
  *H01L 23/04* (2006.01)

(52) U.S. Cl.
  CPC ........ *H01L 23/3675* (2013.01); *H01L 23/345* (2013.01); *H01L 23/04* (2013.01); *H01L 23/367* (2013.01); *H01L 23/3672* (2013.01)

(58) Field of Classification Search
  CPC ............... H01L 23/3675; H01L 23/345; H01L 23/3672; H01L 23/367; H01L 23/04
  See application file for complete search history.

(56) References Cited

U.S. PATENT DOCUMENTS

| | | | |
|---|---|---|---|
| 4,374,316 A | 2/1983 | Inamori et al. | |
| 6,219,239 B1* | 4/2001 | Mellberg | H05K 9/002 174/351 |
| 8,937,807 B2 | 1/2015 | Baquiano et al. | |
| 10,292,253 B2 | 5/2019 | Li et al. | |
| 2002/0134543 A1 | 9/2002 | Estes et al. | |
| 2008/0122067 A1* | 5/2008 | Wang | H01L 23/4334 257/706 |
| 2015/0162307 A1* | 6/2015 | Chen | H01L 23/367 438/107 |

FOREIGN PATENT DOCUMENTS

| | | |
|---|---|---|
| CN | 101685410 A | 3/2010 |
| CN | 106531705 A | 3/2017 |
| GB | 1307818 A | 2/1973 |
| JP | 4821507 B2 | 11/2011 |

* cited by examiner

*Primary Examiner* — Patricia D Valenzuela
(74) *Attorney, Agent, or Firm* — Hewlett Packard Enterprise Patent Department

(57) ABSTRACT

Examples include a computing system including a heater element for heating a processor device installed in the computing system. The computing system includes a chassis, a circuit board assembly housed in the chassis and a heat sink assembly disposed on the chassis to form a cover of the chassis. The circuit board assembly includes a processor package including a substrate having a first portion and a second portion. The processor package includes the processor device disposed on the first portion of the substrate. The heater element disposed on the second portion of the substrate. In the computing system, the heat sink assembly is disposed on the chassis such that a gap separates the heat sink assembly and the heater element.

17 Claims, 5 Drawing Sheets

HEATER ELEMENTS FOR PROCESSOR DEVICES

BACKGROUND

With the advent of edge computing, computing systems such as edge devices designed to perform intensive processing are increasingly being deployed at the edge (e.g., at or near the physical location where endpoint devices reside) of the local network rather than in large and dedicated datacenters that are often used to provide cloud computing services. Edge devices such as routers, switches, integrated access devices (IADs), and multiplexers generally serve as entry points for enterprise networks, service core provider networks, or other types of networks. An embedded computing system, such as a computer-on-module (COM) or another type of single-board computer (SBC), can be included in an edge device to provide desired processing capability and other types of functionality.

BRIEF DESCRIPTION OF THE DRAWINGS

These and other features, aspects, and advantages of the present specification will become better understood when the following detailed description is read with reference to the accompanying drawings in which like characters represent like parts throughout the drawings, wherein.

Figure 1:
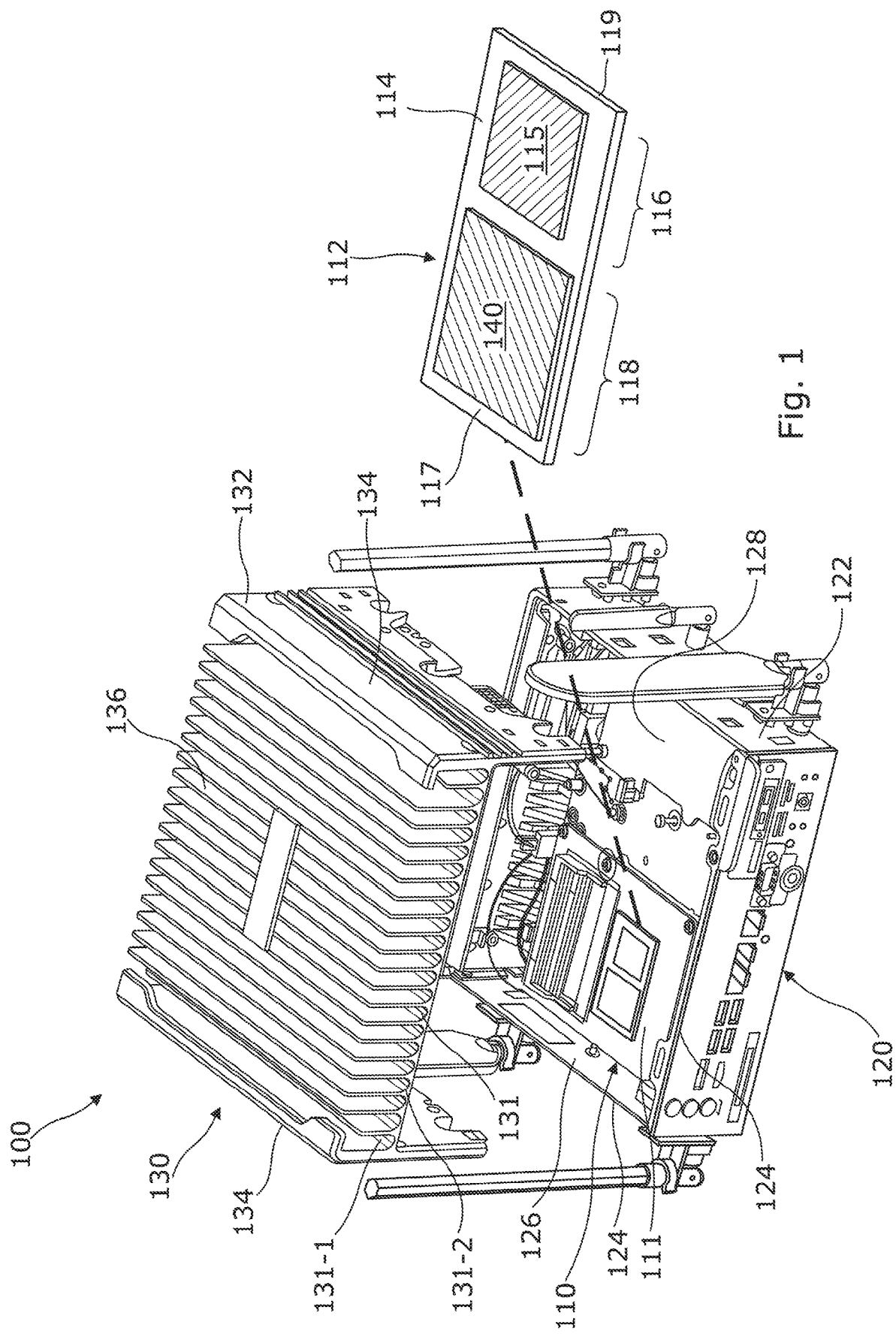
FIG. 1 is an exploded perspective view of a computing system, in accordance with an example.

Various elements and features in FIGS. 1-5 are not drawn to scale and are used for illustration purposes only. In fact, the dimensions of the various features may be arbitrarily increased or reduced for clarity of discussion.

DETAILED DESCRIPTION

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two as or more than two. The term "another," as used herein, is defined as at least a second or more. The term "and/or" as used herein refers to and encompasses any and all possible combinations of the associated listed items. It will also be understood that, although the terms first, second, etc. may be used herein to describe various elements, these elements should not be limited by these terms, as these terms are only used to distinguish one element from another unless stated otherwise or the context indicates otherwise.

Edge devices may be employed for many different purposes in many different types of environments and required to comply with several specifications in accordance with the environments in which they operate. Edge devices that are not located in datacenters cannot leverage the environmental control benefits provided in datacenters. Such edge devices may be expected to function reliably in much harsher environments where ambient temperatures may range from −30 degrees Celsius to 70 degrees Celsius without the benefit of infrastructure that is typically included in datacenters to regulate ambient temperature. Furthermore, edge devices may be expected to satisfy relatively tight space constraints that often do not apply to hardware that is designed to fit into spacious datacenters. One way to make an edge device more compact and more robust to wide temperature fluctuations is to incorporate a heat sink into the chassis of the edge device such that fins of the heat sink are positioned along an exterior side of the chassis.

In many instances, edge devices need to operate in low temperature environments having ambient temperatures lower than 0 degree Celsius (e.g. −40 degrees Celsius). However, processors such as computer-on-module (COM) Express processors, generally, operate above 0 degree Celsius. In such scenarios, the low temperature of the environment inhibit the boot startup of the devices. The heat sink present in these devices may further inhibit the boot startup as they draw away the heat energy that may be needed to increase the temperature of the processors. In order to deal with such issues, CPUs' are, generally, sorted to identify ones with greater operating temperature ranges for such devices. However, this approach may not be applicable for COM Express processors and/or there may be a risk of a skewed inventory due to the fall-out rate. In some instances, a heater may be used for heating the processors in the low temperature environments to satisfy operating temperature requirement for the boot startup. For example, a heater may be installed on or near the heat sink. However, available designs are not efficient in utilizing power and maintaining good efficiency of heat sink, and are not suitable across various environments.

Examples in accordance with the present subject matter described herein provide computing systems that include a heater element disposed on a portion of a processor package to heat the processor device (e.g., a central processing unit (CPU)), when required (e.g., for the boot startup), in low temperature environments. In the described systems, the heater element is separated from the heat sink and hence does not waste energy unnecessarily by attempting to heat the heat sink, which may, otherwise, reduce its efficiency. Furthermore, the heater element may be disposed on the processor package such that it allows the heat sink to thermally couple to the processor device. This enables the heat sink to efficiently dissipate heat generated during the operation of the computing system.

According to the aspects described herein, a computing system includes a chassis, a circuit board assembly housed in the chassis and a heat sink assembly disposed on the chassis to form a cover of the chassis. The circuit board assembly includes a processor package. The processor package includes a substrate having a first portion and a second portion; and a processor device disposed on the first portion of the substrate. The computing system further includes a heater element disposed on the second portion of the substrate. In an example, the heater element substantially conform to the second portion of the substrate. In the computing system, the heat sink assembly is disposed on the chassis such that a gap separates the heat sink assembly and the heater element.

As used herein, 'processor package' may refer to an electronic component that includes a processor device (e.g., CPU) in form of a chip. The processor package generally includes a substrate and the processor device disposed on the substrate.

The term "disposed on" may mean that an object or element is coupled to, deposited on, or grown on a surface of another object or element. In an example, an object or element may be disposed directly on a surface of another object or element with or without an intervening layer. The term "coupled," as used herein, is defined as connected, whether directly without any intervening elements or indirectly with at least one intervening element, unless otherwise indicated. Two elements can be connected mechanically, electrically, or communicatively. The term "thermally coupled" means that two elements may be in contact with each other or connected mechanically to transfer heat through conduction.

FIG. 1 illustrates a perspective view of a computing system 100 (referred to as system 100, herein), according to an example of the present subject matter. The system 100 may be any electronics device that includes one or multiple processor devices (CPU(s), for example). In certain examples, the system 100 may be an edge device that may perform edge related computing functions. For example, the system 100 may perform processing functions related to processing data (e.g., sensor data) near the "edge" of a network where the data is acquired, as compared to, for example, performing this processing on a remotely disposed cloud-based server. As such, the system 100 may be used for, as examples, processing data related to an assembly line, a molding machine tool, a camera system, and so forth, depending on the particular implementation.

As illustrated in FIG. 1, the system 100 includes a circuit board assembly 110 that is housed in a chassis 120 and a heat sink assembly 130. The circuit board assembly 110 may be mounted to the chassis 120. The heat sink assembly 130 may serve dual functions: the heat sink assembly 130 may enhance the removal of thermal energy from heat-generating component(s) of the circuit board assembly 110 to the surrounding environment and the heat sink assembly 130 may form a cover of the chassis 120 when disposed on the chassis 120.

The circuit board assembly 110 may include one or more heat-generating components that, due to their operations, may produce heat. Heat generated by the component(s) may be transferred to the heat sink assembly 130 through conduction, and the heat sink assembly 130 transfers this heat to the surrounding environment via convection.

In the example implementations described herein, the heat sink assembly 130 may form a cover of the chassis 120 to form an enclosure for a housing of the system 100, where the bottom floor and sidewalls of the enclosure are formed from a bottom floor and sidewalls of the chassis 120. In this regard, as depicted in FIG. 1, the chassis 120 may be an open structure, which has a bottom floor (not shown in Figures) to which the circuit board assembly 110 is mounted and four sidewalls 124 that extend orthogonally from the bottom floor at the floor's outer periphery. The upper edges of the sidewalls 124 define an opening 128 of the chassis 120 (and opening of the enclosure); and the heat sink assembly 130 may be removably mounted to the sidewalls 124 to close the opening 128 to complete the enclosure.

The circuit board assembly 110 may include a main circuit board 111 (a motherboard or backplane, as examples) that is mounted to the floor of the chassis 120 via standoffs and fasteners, such as machine screws. Various components including heat-generating component(s) and non-heat generating component(s) may be installed directly or indirectly on the main circuit board 111. In the example implementations described herein, some of these components may be mounted to the main circuit board 111 via a permanent type of mounting, such as soldered connection in which the external terminals or pads of the components are soldered to traces of the circuit board 111. Other of these components may be directly or indirectly mounted to the main circuit board 111 via a removable mounting, such as a mounting in which the external terminals or pads of the components are inserted into a slot connector or socket, which has, for example, spring-like electrical contacts.

In this context, "direct" mounting to the main circuit board 111 may mean that a component is mounted to the circuit board 111 without an intervening circuit board being between the component and the circuit board 111. "Indirect" mounting may mean that a component is being mounted to another circuit board that is being directly or indirectly mounted to the main circuit board 111.

In the example implementations described herein, the circuit board 111 may include a processor package 112. The processor package 112 may be a heat-generating component. In an example, the processor package 112 may be installed in a connector or socket on the circuit board 111. In another example, the processor package 112 may be installed in a connector or socket in another circuit board, and another circuit board may be installed in the main circuit board 111. As examples, another circuit board may be a mezzanine circuit card that is installed in a slot connector of the main circuit board 111 or a module that installed in connector or socket of the main circuit board 111.

In certain examples, a computer-on-module (COM) Express module may be installed in a connector or socket on the main circuit board 111 and the COM Express module may include the processor package 112 and one or more other heat-generating components such as other processor package(s) and memory module(s). In such examples, the processor package 112 may include a processor (e.g., a COM Express processor) that operates at temperatures above 0 degree Celsius.

The processor package 112 may include a substrate 114 and a processor device 115 disposed on the substrate 114. The substrate 114 may include a substantially planar body (i.e., flat) of any shape, having a relatively constant, thin thickness that defines spaced parallel surfaces 117 and 119. As depicted in FIG. 1, the substrate 114 may be rectangular in shape. Although FIG. 1 shows rectangular shaped substrate 114 for simplicity and clarity, the substrate 114 may be polygonal, circular or elliptical in shape.

The substrate 114 may include a first portion 116 and a second portion 118. In an example, the first portion 116 and the second portion 118 may together form the substrate 114. The processor device 115 may be disposed on the first portion 116 of the substrate 114. The remaining portion of the substrate 114 may form the second portion 118 of the substrate 114. In an example, the processor device 115 may include a COM Express processor.

In accordance with examples described herein, a heater element 140 may be disposed on the surface 117 of the substrate 114 in the second portion 118. In an example, the heater element 140 may include a resistive heater. When energized, the heater element 140 may heat the processor device 115. In an example, a thermal conducting material may be disposed between the heater element 140 and the processor device 115 to create a heat transferring interface.

The heater element 140 may include a substantially planar body of any shape. The heater element 140 may be a layer, sheet, membrane or film. The thickness of the heater element 140 can vary, and may be in a range from about 0.1 millimeter to about 5 millimeters. In some embodiments, the thickness may range from about 0.5 millimeter to about 2 millimeter, and in some examples, from about 0.5 millimeter to about 1 millimeter. In certain example, the thickness of the heater element 140 is less than a thickness of the processor device 115.

In some examples, the heater element 140 may be shaped to substantially conform to the second portion 118 of the substrate 114. As used herein, the term "substantially conform" may mean that the heater element 140 may be shaped to fully or partially conform to the second portion 118 of the substrate 114. For example, the heater element 140 may be shaped to conform to more than 50 percent of the area of the second portion 118 of the substrate 114. As depicted in FIG. 1, the substrate 114 may be rectangular in shape. In other examples, substrate 114 may be polygonal, circular, elliptical or any other shape to substantially conform to the second portion 118 of the substrate 114.

In the examples described herein, the heater element 140 may be in physical contact with the surface 117 of the substrate 114 in the second portion 118. The heater element 140 may be installed and fixed on the surface 117 in the second portion 118. In some examples, the heater element 140 may have an adhesive backing that allows for conveniently adhering the heater element 140 on the surface 117 in the second portion 118 of the substrate 114.

In accordance with some aspects of the present disclosure, when the heat sink assembly 130 is disposed on the chassis 120, a gap 250 (FIG. 2) may exist between the heat sink assembly 130 and the heater element 140, as described further herein. The gap 250 may separate the heat sink assembly 130 and the heater element 140. That is, the heat sink assembly 130 may not be in contact with the heater element 140.

The heat sink assembly 130 includes a top portion 132 that is constructed to extend across the opening 128 of the chassis 120 when the heat sink assembly 130 is mounted to the chassis 120. The heat sink assembly 130 may include a pair of opposing sidewalls 134 that extend orthogonally from the top portion 132; and when the heat sink assembly 130 is mounted to the chassis 120, the sidewalls 134 extend over parallel sidewalls 124 of the chassis 120.

As depicted in FIG. 1, the top portion 132 of the heat sink assembly 130 may include a base plate 131 that forms a base for the heat sink assembly 130 and extend across the opening 128 of the chassis 120 when the heat sink assembly 130 is mounted to the chassis 120. In general, the base plate 131 may include an upper or externally facing surface 131-1 that is oriented in a direction that extends away from the circuit board assembly 110 and a lower or inwardly facing surface 131-2 that is oriented in a direction that extends toward the components of the circuit board assembly 110 and faces the interior of the chassis 120. The base plate 131 may be formed from a thermally conductive materials, such as aluminum, copper, or a metal alloy.

The heat sink assembly 130 may also include, as depicted in FIG. 1, parallel fins 136 that may be integral with the base plate 131. The fins 136 may be integral with the base plate 131, constructed from the same thermally conductive material of the base plate 131, and extends outwardly from the upper surface 131-1 of the base plate 131. In general, the fins 136 may extend longitudinally along the base plate 131 for purposes of creating an enhanced surface area for transferring thermal energy to the surrounding environment (e.g., the surrounding air) via thermal convection.

In some implementations, the heat sink assembly 130 may be a passive heat sink, in that the fins 136 are disposed on the outside of the enclosure for the system 100, and the system 100 may not include any forced air-typed devices, such as a fan, to assist in the removal of thermal energy from the heat sink assembly 130.

Figure 2:
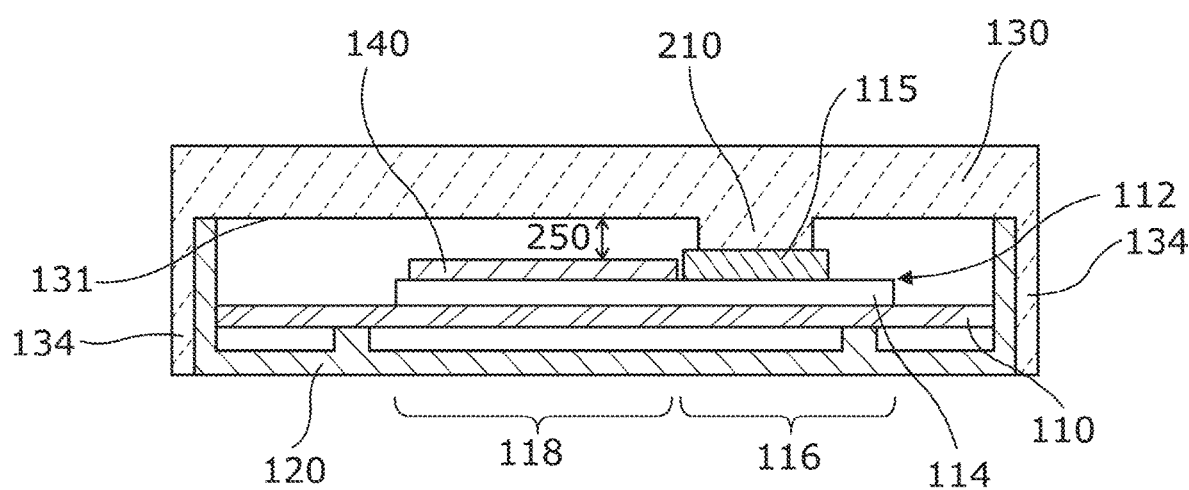
FIG. 2 is a perspective cross-sectional view of the computing system of FIG. 1, in accordance with an example.

The heat sink assembly 130 may also include one or more protruded portions (not shown in FIG. 1) arranged randomly or in a pattern along the plane in which the base plate 131 lies. An example protruded portion 210 is shown in FIG. 2. As used herein, the term "protruded portion" may refer to any type of protrusion that is configured to be in contact, coupled or inserted into an indentation in order to thermally couple two physical objects together or any type of indentation that is configured to have a protrusion inserted therein. The protruded portion(s) may serve as a mechanism that can thermally couple the heat sink assembly 130 with a component on the circuit board assembly 110. Some examples of protruded portion(s) may include sockets or pins. In addition, any protruded portion(s) that may not be used to couple the heat sink assembly 130 to a component on the circuit board assembly 110 may serve to increase the surface area of the heat sink assembly 130 through which heat can dissipate (albeit into the interior of the chassis rather than the exterior).

FIG. 2 schematically illustrates a cross-sectional view of the system 100 when the heat sink assembly 130 is disposed on the chassis 120. As depicted in FIG. 2, the heat sink assembly 130 may be mounted on the chassis 120 enclosing the circuit board assembly 110. The processor package 112 may be installed on the circuit board assembly 110. The processor package 112 may include the processor device 115 disposed on the first portion 116 of the substrate 114. The heater element 140 may be disposed on the second portion 118 of the substrate 114. As depicted, a gap 250 (again, theses dimensions are for illustration purposes only) separates the heat sink assembly 130 and the heater element 140. That is, in the examples described herein, the heat sink assembly 130 is not in contact with the heater element 140. In an example, the gap 250 may be sufficient in size to accommodate an amount of air and prevent any thermal contact between the heat sink assembly 130 and the heater element 140.

Further, FIG. 2 shows a protruded portion 210 extending from the lower surface 131-2 of the base plate 131 of the heat sink assembly 130. The protruded portion 210 may be located corresponding to a location of the first portion 114 such that the protruded portion 210 is in contact with the processor device 115 when the heat sink assembly 130 is mounted on the chassis 120. In the examples described herein, the protruded portion 210 of the heat sink assembly 130 is not in contact with the heater element 140. During operation, when processor device 115 generates heat, the protruded portion 210 may transfer the heat generated from the processor device 115 to the heat sink assembly 130.

When the system 100, as depicted in FIG. 2, is installed to operate at a low temperature (i.e., lower than 0 degree Celsius) environment, the heater element 140 may be operated to heat the processor device 115 up to its operating temperature (e.g., about 0 degree Celsius or above) to startup the processor device and thus the system 100. During operation of the system 100, when the processor package 112 and other heat-generating components generate heat, the protruded portion 210 transfers the heat to the heat sink assembly 130 that dissipates the heat outside the system 100.

In an example, the system 100 may further include a temperature sensor (not shown in figures) for measuring the temperature of the processor device 115 and a controller (not shown in figures) for controlling the operation of the heater element 140. For starting the system 100, first, the controller may determine whether power to the system 100 is supplied (i.e. system power is ON). When the power is supplied to the system 100, the controller may obtain the temperature of the processor device 115 from the temperature sensor. The controller may, then, determine whether the temperature of the processor device 115 received from the temperature sensor is lower than 0 degree Celsius. Once the controller determines that the temperature of the processor device 115 received from the temperature sensor is lower than 0 degree Celsius, the controller may allow to apply power to the heater element 140. The heater element 140 operates and starts heating the processor device 115. In an example, the controller may track the temperature of the processor device 115 using the temperature sensor and stop applying power to the heater element 140 when the temperature of the processor device 115 reaches to its operating temperature (e.g., above 0 degree Celsius). In another example, the controller may use a timer that triggers ON, when power is applied to the heater element 140 for a predetermined period of time that may be required for heating the processor device 115 to reach to its operating temperature. As the timer runs over the predetermined period of time, the controller may stop applying power to the heater element 140. Once the temperature of the processor device 115 reaches to its operating temperature, the processor device 115 starts operating.

Figures 3A, 3B, 3C:
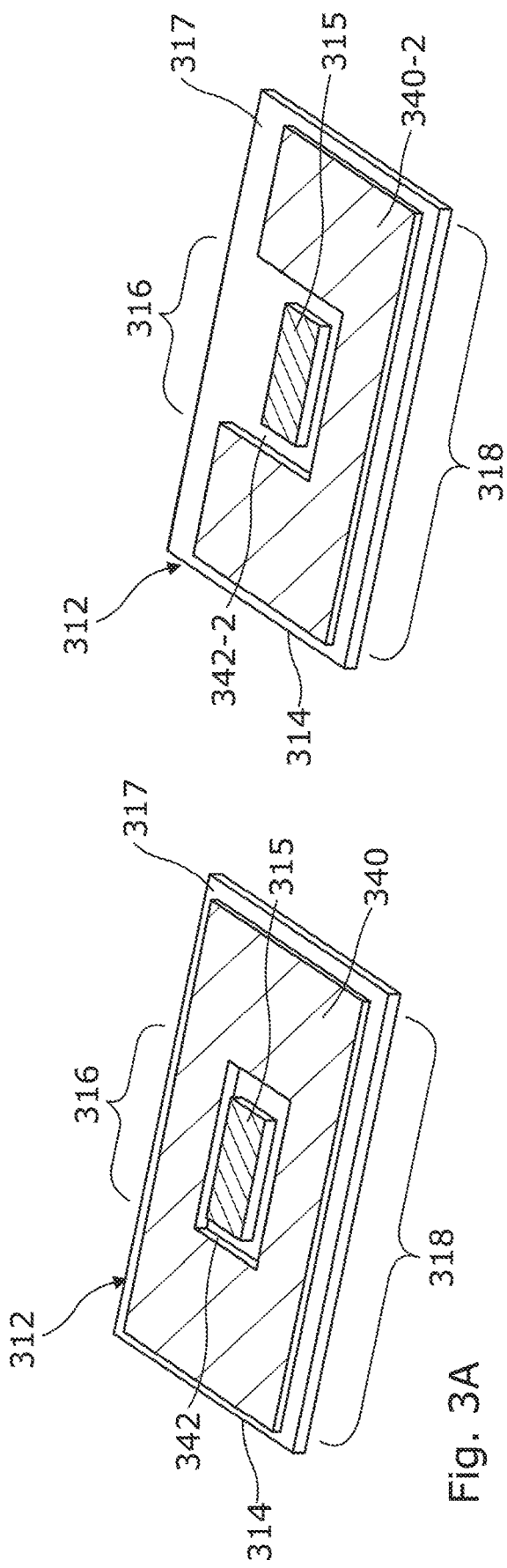
FIGS. 3A-3C show perspective views of three example heater elements, each disposed on a processor package.

FIGS. 3A-3C show other examples of a heater element disposed on a substrate of a processor package that may be used in a system (e.g., an edge device). In the examples illustrated in FIGS. 3A-3C, a processor package 312 includes a substrate 314 and a processor device 315 disposed on a first portion 316 of the substrate 314. The remaining portion of the substrate 314 may form a second portion 318 of the substrate 314. The first portion 316 and the second portion 318 together form the substrate 314. In these examples, the second portion 318 surrounds the first portion 316. In the example illustrated in FIG. 3A, a heating element 340 shaped to fully conform to the second portion 318 of the substrate 314 may be disposed on a surface 317 of the second portion 318. The heating element 340 may include an opening 342 corresponding to a location of the first portion 316. In the examples illustrated in FIGS. 3B and 3C, heating elements 340-1 and 340-2 may be shaped to partially conform to the second portion 318 of the substrate 314. In these examples, the heating elements 340-1 and 340-2 may have openings 342-1 and 342-2 corresponding to the location of the first portion 316. The openings (342, 342-1 and 342-2) in the heating elements (340, 340-1 and 340-2) may allow the processor device 115 to be exposed to the heat sink assembly 130.

Figure 4:
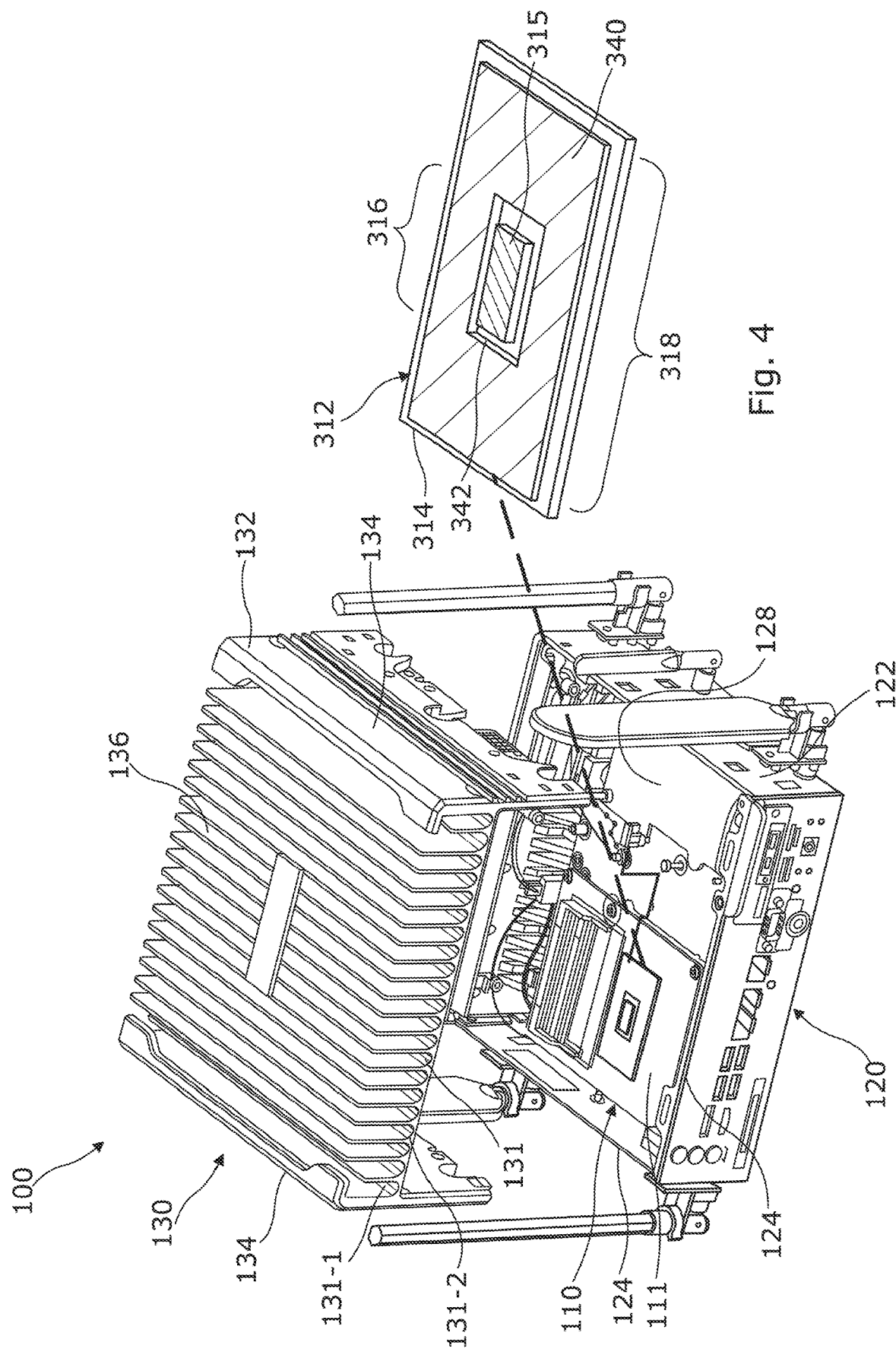
FIG. 4 is an exploded perspective view of a computing system, in accordance with an example.

FIG. 4 is an exploded perspective view of a system 400, in accordance with an example. The system 400 may include certain elements similar to those described in FIG. 1 which are marked with similar reference numerals, description of which are not repeated herein. In comparison to FIG. 1, the system 400 includes the heater element 340 disposed on the processor package 312 as shown in FIG. 3A. In a similar fashion as described in FIG. 1, the heater element 340 may be energized to heat the processor device 115. The operation of the heater element 340 may be controlled by a controller, as described previously.

Figure 5:
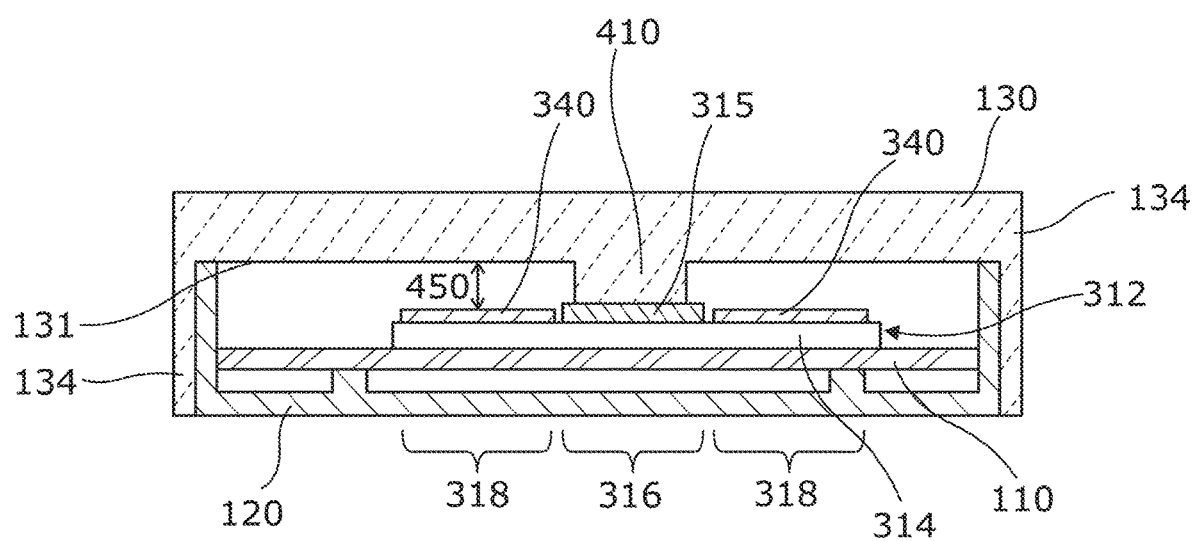
FIG. 5 is a perspective cross-sectional view of the computing system of FIG. 4, in accordance with an example.

FIG. 5 schematically illustrates a cross-sectional view of the system 400 depicted in FIG. 4 when the heat sink assembly 130 is mounted on the chassis 120. Certain elements and features in FIG. 5 may be similar to those described in FIGS. 1 and 2 which are marked with similar reference numerals, description of which are not repeated herein. In a similar fashion as described in FIG. 2 (again, the dimensions are for illustration purposes only), a gap 450 separates the heat sink assembly 130 and the heater element 340. That is, the heat sink assembly 130 is not in contact with the heater element 340. In an example, the gap 450 may be sufficient in size to accommodate an amount of air and may not allow the heat sink assembly 130 to be in contact with the heater element 340. Further, the heat sink assembly 130 may include a protruding portion 410 extending from the lower surface 131-2 of the base plate 131 of the heat sink assembly 130. The protruded portion 410 may be located corresponding to a location of the first portion 316 of the substrate 314. The opening 342 of the heater element 340 may allow the protruded portion 410 to be in contact with the processor device 115 and thereby thermally couple the heat sink assembly 130 to the processor device 115. During operation, when processor device 115 generates heat, the protruded portion 410 transfers the heat generated from the processor device 115 to the heat sink assembly 130 to dissipate the heat outside the system 400.

In the examples described herein, the systems provide efficient heating of a processor device while starting the system in low temperature environment and also maintains good efficiency of the heat sink assembly during operation of the system. As compared to currently available systems that may include a heater disposed on a heat sink, the present configuration allows that the heater element is in contact with the processor package and not in contact with the heat sink assembly. In such configuration, the heater element (i) requires less power as well as less time to heat the processor package and (ii) does not heat the heat sink assembly, while starting the system. Thus, the described configuration is much more efficient in power utilization for heating the processor package while starting the system as well as in dissipating heat from the system as compared to the available configurations.

EXAMPLE

The example that follows is merely illustrative, and should not be construed to be any sort of limitation on the scope of the claimed invention.

Example 1

A heater element shaped as shown in FIG. 3A was installed on a substrate of a COM Express module containing a COM Express processor in a computing system similar to as shown in FIG. 4.

Example 2

A heater element similar to as used in example 1 was installed on a base plate of a heat sink in a computing system (similar to as used in example 1) such that the opening of the heater element allows to thermally couple the heat sink to the COM Express processor.

Two computing systems: system 1 (example 1) and system 2 (example 2) were employed in a low temperature environment having a temperature about −30 degrees Celsius. Power was supplied to heater elements in system 1 and system 2 to heat the COM Express processors to reach to 0 degree Celsius. It was found that power supplied to system 2 was three times more than the power supplied to system 1. Also, the time to heat from −30 degrees Celsius to 0 degree Celsius was much less for system 1 compared to system 2.

It should be understood that the above-described examples are merely illustrative of some of the many specific examples that represent the principles described herein. Clearly, those skilled in the art can readily devise numerous other arrangements without departing from the scope as defined by the following claims.

The invention claimed is:

1. A computing system comprising:
a chassis;
a circuit board assembly housed in the chassis, wherein the circuit board assembly comprises:
a processor package comprising:
a substrate having a first surface, a second surface, a first portion, and a second portion, wherein the first surface and the second surface are parallel to each other, and wherein the first portion and the second portion are on the first surface of the substrate; and
a processor device disposed on the first portion of the substrate; and
a heater element disposed on the first surface in the second portion of the substrate, the heater element including a substantially planar body and shaped to conform to more than fifty percent of an area of the second portion; and
a heat sink assembly disposed on the chassis to form a cover of the chassis such that a gap separates the heat sink assembly and the heater element.

2. The computing system of claim 1, wherein the planar body comprises a layer, sheet, membrane, or film.

3. The computing system of claim 1, wherein the heater element is further shaped to fully conform to the second portion of the substrate.

4. The computing system of claim 1, wherein the heat sink assembly comprises a protruded portion extending from an interior surface of a base of the heat sink assembly to thermally couple to the processor device.

5. The computing system of claim 1, wherein
the second portion surrounds the first portion; and
the heater element comprises an opening corresponding to a location of the first portion.

6. The computing system of claim 5, wherein the opening allows the heat sink assembly to thermally couple to the processor device.

7. The computing system of claim 1, wherein the gap is sufficient in size to prevent a thermal contact between the heater element and the heat sink assembly.

8. The computing system of claim 1, wherein the heater element operates to heat the processor device during startup of the computing system.

9. A circuit board assembly comprising:
a processor package comprising:
a substrate having a first surface, a second surface, a first portion and a second portion, wherein the first surface and the second surface are parallel to each other, and wherein the first portion and the second portion are on the first surface of the substrate;
a central processing unit (CPU) mounted to the first portion of the substrate; and
a heater element disposed on the first surface in the second portion of the substrate, the heater element including a substantially planar body and shaped to conform to more than fifty percent of an area of the second portion.

10. The circuit board assembly of claim 9, wherein the second portion surrounds the first portion and the heater element comprises an opening corresponding to a location of the first portion.

11. A computing system comprising:
a chassis;
a circuit board assembly housed in the chassis, wherein the circuit board assembly comprises:
a processor package comprising:
a substrate having a first surface, a second surface, a first portion and a second portion, wherein the first surface and the second surface are parallel to each other, and wherein the first portion and the second portion are on the first surface of the substrate; and
a processor device disposed on the first portion of the substrate; and
a heater element disposed on the first surface in the second portion of the substrate, the heater element including a substantially planar body and shaped to conform to more than fifty percent of an area of the second portion; and
a heat sink assembly disposed on the chassis to form a cover of the chassis such that the heat sink assembly is in contact with the processor device and not in contact with the heater element.

12. The computing system of claim 11, wherein the heater element is further shaped to fully conform to the second portion of the substrate.

13. The computing system of claim 11, wherein the heat sink assembly comprises a protruded portion extending from an interior surface of a base of the heat sink assembly to thermally couple to the processor device.

14. The computing system of claim 11, wherein
the second portion surrounds the first portion; and
the heater element comprises an opening corresponding to a location of the first portion.

15. The computing system of claim 14, wherein the opening allows the heat sink assembly to thermally couple to the processor device.

16. The computing system of claim 11, wherein the gap is sufficient in size to prevent a thermal contact between the heater element and the heat sink assembly.

17. The computing system of claim 11, wherein the heater element operates to heat the processor device during startup of the computing system.

* * * * *